US005596742A

United States Patent [19]
Agarwal et al.

[11] Patent Number: 5,596,742
[45] Date of Patent: Jan. 21, 1997

[54] VIRTUAL INTERCONNECTIONS FOR RECONFIGURABLE LOGIC SYSTEMS

[75] Inventors: Anant Agarwal, Framingham, Mass.; Jonathan Babb, Ringgold, Ga.; Russell Tessier, Cambridge, Mass.

[73] Assignee: Massachusetts Institute of Technology, Cambridge, Mass.

[21] Appl. No.: 42,151

[22] Filed: Apr. 2, 1993

[51] Int. Cl.$^6$ .................................................. G06F 17/50
[52] U.S. Cl. ........................ 395/500; 364/488; 364/489
[58] Field of Search .......................... 364/232.3, 949.9, 364/488, 489, 490, 491, 578; 395/500; 326/37, 38, 39, 41, 47, 101

[56] References Cited

U.S. PATENT DOCUMENTS

| | | | |
|---|---|---|---|
| 4,495,590 | 1/1985 | Mitchell, Jr. | 364/716 |
| 4,506,341 | 3/1985 | Kalter et al. | 364/786 |
| 4,697,241 | 9/1987 | Lavi | 364/488 |
| 4,901,259 | 2/1990 | Watkins | 364/578 |
| 5,109,353 | 4/1992 | Sample et al. | 362/578 |
| 5,283,900 | 2/1994 | Frankel et al. | 395/700 |
| 5,442,306 | 8/1995 | Woo | 326/39 |
| 5,444,394 | 8/1995 | Watson et al. | 326/45 |
| 5,452,231 | 9/1995 | Butts et al. | 364/489 |
| 5,473,266 | 12/1995 | Ahanin et al. | 326/41 |
| 5,475,830 | 12/1995 | Chen et al. | 395/500 |
| 5,483,178 | 1/1996 | Costello et al. | 326/41 |
| 5,485,103 | 1/1996 | Pedersen et al. | 326/41 |

FOREIGN PATENT DOCUMENTS

| | | |
|---|---|---|
| 0410502A2 | 1/1991 | European Pat. Off. . |
| 90/04233 | 4/1990 | WIPO . |

OTHER PUBLICATIONS

Khan et al., "FPGA Architectures for ASIC Hardware Emulators," 1993 ASIC Conference & Exhibit, pp. 336–340.

Walters, "Reprogrammable Hardware Emulation for ASICs Makes Thorough Design Verification Practical," Compcon Spring '90, pp. 484–486.

Deiss, Stephen, R., "Connectionism without the Connections," *IEEE*, (1994), pp. 1217–1221.

Dominguez–Castro, R., et al., "Architectures and Building Blocks for CMOS VLSI Analog Neural Programmable Optimizers," *IEEE*, (1992), pp. 1525–1528.

Fornaciari, William, et al., "An Automatic VLSI Implementation of Hopfield ANNs,", *IEEE*, (1995), pp. 499–502.

Bailey, Jim, et al., "Why VLSI Implementations of Associative VLCNs Require Connection Multiplexing," pp. II –173 –II –180.

Dally, "Virtual–Channel Flow Control" *IEEE Transactions on Parallel and Distributed Systems*, vol. 3, No. 2 (Mar. 1992) pp. 194–205.

(List continued on next page.)

*Primary Examiner*—Kevin J. Teska
*Assistant Examiner*—Leigh Marie Garbowski
*Attorney, Agent, or Firm*—Hamilton, Brook, Smith & Reynolds, P.C.

[57] ABSTRACT

A compilation technique overcomes device pin limitations using virtual interconnections. Virtual interconnections overcome pin limitations by intelligently multiplexing each physical wire among multiple logical wires and pipelining these connections at the maximum clocking frequency. Virtual interconnections increase usable bandwidth and relax the absolute limits imposed on gate utilization in logic emulation systems employing Field Programmable Gate Arrays (FPGAs). A "softwire" compiler utilizes static routing and relies on minimal hardware support. The technique can be applied to any topology and FPGA device.

42 Claims, 6 Drawing Sheets

OTHER PUBLICATIONS

Burskey, "Using Antifuse Programming For Gate–Arrayed Density and Flexibility, An FPGAs Family Also Delivers Masked–Array Performance. FPGas Mirror Masked Gate–Array Architecture" *Electronic Design*, (Nov. 21, 1991) pp. 63–70.

Kermani et al., "Virtual Cut–Through: A New Computer Communication Switching Technique", *Computer Networks*, vol. 3, (Oct. 1979) pp. 267–286.

Murgai et al., "Logic Synthesis for Programmable Gate Arrays" *IEEE 27th ACM/IEEE Design Automation Conference*, (1990) pp. 620–625.

Singh et al, "Optimization of Field–Programmable Gate Array Logic Block Architecture for Speed" *IEEE 1991 Custom Integrated Circuits Conference* (1991) pp. 6.1.1–6.1.6.

Witienberg, R. C., "Three Newcomers Stir Up Hardware Accelerator Market," no further information.

Bursky, D., "Fast simulator expands to mimic 4 million gates," *Electronic Design*, p. 23, (Dec. 1986).

Bertsekas, D., et al., *Data Networks*, pp. 8–14, 91–95 and 403–405 (Prentice Hall 1987).

Rose, Jonathan, et al, "Architecture of Field–Programmable Gate Arrays: The Effect of logic Block Functionality on Area Efficiency," IEEE Journal of Solid State Circuits, No. 5, Oct. 1990, pp. 1217–1225.

Babb, Jonatha, et al., "Virtual Wires: Overcoming Pin Limitations in FPGA–based Logic Emulators," Proceedings IEEE Workshop on FPGAs for Custom Computing Machines, Apr. 5, 1993, pp. 142–151.

Hey, Anthony, "Supercomputing with Transputers –Past, Present and Future," *Computer Architecture News*, vol. 18, No. 3, Sep. 1990, pp. 479–489.

Agrawal, Om, "Field Programmable Gate Arrays (FPGAs) Provide ASIC System Designers Control Of Their Design Destiny," Electro Conference Record, vol. 15, May 1990, pp. 353–361.

Van Den Bout, D. E., et al., "IEEE Design and Test of Computers," *IEEE Computer Society*, pp. 21–30, Sep. 1992.

XILINX: The Programmable Gate Array Design Handbook, 1986, pp. 1–9 to 1–14.

Wei, Yen–Chuen, et al., "Multiple–Level Partitioning: An Application to the Very Large–Scale Hardware Simulator," *IEEE*, 26(5) : 706–716, (May 1991).

VIRTUAL INTERCONNECTIONS FOR RECONFIGURABLE LOGIC SYSTEMS

GOVERNMENT SUPPORT

The invention described herein was supported in whole or in part by Navy Contract No. N00014-91-J-1698 and Grant No. MIP-9012773 from the National Science Foundation (NSF).

BACKGROUND OF THE INVENTION

Field Programmable Gate Array (FPGA) based logic emulators are capable of emulating complex logic designs at clock speeds four to six orders of magnitude faster than even an accelerated software simulator. Once configured, an FPGA-based emulator is a heterogeneous network of special purpose processors, each FPGA processor being specifically designed to cooperatively execute a partition of the overall simulated circuit. As parallel processors, these emulators are characterized by their interconnection topology (network), target FPGA (processor), and supporting software (compiler). The interconnection topology describes the arrangement of FPGA devices and routing resources (i.e. full crossbar, two dimension mesh, etc). Important target FPGA properties include gate count (computational resources), pin count (communication resources), and mapping efficiency. Supporting software is extensive, combining netlist translators, logic optimizers, technology mappers, global and FPGA-specific partitioners, placers, and routers.

FPGA-based logic emulation systems have been developed for design complexity ranging from several thousand to several million gates. Typically, the software for these system is considered the most complex component. Emulation systems have been developed that interconnect FPGAs in a two-dimensional mesh and in a partial crossbar topology. In addition, a hierarchical approach to interconnection has been developed. Another approach uses a combination of nearest neighbor and crossbar interconnections. Logic partitions are typically hardwired to FPGAs following partition placement.

Statically routed networks can be used whenever communication can be predetermined. Static refers to the fact that all data movement can be determined and optimized at compile-time. This mechanism has been used in scheduling real-time communication in a multiprocessor environment. Other related uses of static routing include FPGA-based systolic arrays and in the very large simulation subsystem (VLSS), a massively parallel simulation engine which uses time-division multiplexing to stagger logic evaluation.

SUMMARY OF THE INVENTION

Existing FPGA-based logic emulators suffer from limited inter-chip communication bandwidth, resulting in low gate utilization (10 to 20 percent). This resource imbalance increases the number of chips needed to emulate a particular logic design and thereby decreases emulation speed, because signals must cross more chip boundaries, and increases system cost. Prior art emulators only use a fraction of potential communication bandwidth because the prior art emulators dedicate each FPGA pin (physical wire) to a single emulated signal (logical wire). These logical wires are not active simultaneously and are only switched at emulation clock speeds.

A preferred embodiment of the invention presents a compilation technique to overcome device pin limitations using virtual interconnections. This method can be applied to any topology and FPGA device, although some benefit substantially more than others. Although a preferred embodiment of the invention focuses on logic emulation, the technique of virtual interconnections is also applicable to other areas of reconfigurable logic.

Virtual interconnections overcome pin limitations by intelligently multiplexing each physical wire among multiple logical wires and pipelining these connections at the maximum clocking frequency of the FPGA. A virtual interconnection represents a connection from a logical output on one FPGA to a logical input on another FPGA. Virtual interconnections not only increase usable bandwidth, but also relax the absolute limits imposed on gate utilization. The resulting improvement in bandwidth reduces the need for global interconnect, allowing effective use of low dimension inter-chip connections (such as nearest-neighbor). In a preferred embodiment, a "softwire" compiler utilizes static routing and relies on minimal hardware support. Virtual interconnections can increase FPGA gate utilization beyond 80% without a significant slowdown in emulation speed.

In a preferred embodiment of the invention, a FPGA logic emulation system comprises a plurality of FPGA chips. Each chip has a number of pins for communicating signals between chips. There are also interchip connections between the FPGA pins. In addition, a software or hardware compiler programs each FPGA chip to emulate a partition of an emulated circuit with interconnections between partitions of the emulated circuit being provided through FPGA pins and interchip connections. A partition of the emulated circuit has a number of interconnections to other partitions that exceed the number of pins on the FPGA chip. The chip is programmed to communicate through virtual interconnections in a time-multiplexed fashion through the pins.

The FPGA chips may comprise gates that are programmed to serve as a multiplexer for communicating through the virtual interconnections. Alternatively, the FPGA chips may comprise hardwire multiplexers that are separate from the programmable gates. The pins of the FPGA chips may be directly connected to pins of other FPGA chips, where routing of signals between the chips is through intermediate FPGAs. The FPGA chips may also be programmed to operate in phases within an emulation clock cycle with interchip communications being performed within each phase.

The compiler may optimize partition selection and phase division of an emulated circuit based on interpartition dependencies.

Data may also be accessed from memory elements external to the FPGAs during each phase by multiplexing the data on the virtual interconnections.

In a preferred embodiment of the invention, the FPGA chips comprise an array of gates, shift registers, and several multiplexers. The gates are programmable to emulate a logic circuit. Each shift register receives plural outputs from the program gate array and communicates the outputs through a single pin in a multiplexed fashion. Some fraction of the gates in an FPGA chip may be programmed to serve as shift registers and multiplexer for communicating through virtual connections.

In a preferred embodiment of the invention, a compiler programs a FPGA logic emulation system using a means for partitioning an emulated logic circuit into partitions and means for programming each FPGA to emulate a partition of an emulated circuit. The partitions are to be programmed into individual FPGA chips. The compiler produces virtual interconnections between partitions of the emulated circuit that correspond to one or more common pins with signals along the virtual interconnections being time-multiplexed through the common pin.

The compiler may comprise a dependency analyzer and means for dividing an emulation clock into phases, the phase division being a function of partition dependencies and memory assignments. During the phases, program logic functions are performed and signals are transmitted between the FPGA chips. The compiler may also comprise a router for programming the FPGA chips to route signals between chips through intermediate chips. In particular, the routed signals are virtual interconnections.

Results from compiling two complex designs, the 18K gate SPARCLE microprocessor and the 86K gate Alewife Cache Compiler (A-1000), show that the use of virtual interconnections decreases FPGA chip count by a factor of 3 for SPARCLE and 10 for the A-1000, assuming a crossbar interconnect. With virtual interconnections, a two dimensional torus interconnect can be used for only a small increase in chip count (17 percent for the A-1000 and 0 percent for SPARCLE). Without virtual interconnections, the cost of a replacing the full crossbar with a torus interconnect is over 300 percent for SPARCLE, and virtually impossible for the A-1000. Emulation speeds are comparable with the no virtual interconnections case, ranging from 2 to 8 MHZ for SPARCLE and 1 to 3 MHZ for the A-1000. Neither design was bandwidth limited, but rather constrained by its critical path. With virtual interconnections, use of a lower dimension network reduces emulation speed proportional to the network diameter; a factor of 2 for SPARCLE and 6 for the A-1000 on a two dimensional torus.

BRIEF DESCRIPTION OF THE DRAWINGS

The above and other features of the invention, including various novel details of construction and combinations of parts, will now be more particularly described with reference to the accompanying drawings and pointed out in the claims. It will be understood that the particular virtual interconnection technique embodying the invention is shown by way of illustration only and not as a limitation of the invention. The principles and features of this invention may be employed in varied and numerous embodiments without departing from the scope of the invention.

DETAILED DESCRIPTION OF PREFERRED EMBODIMENTS OF THE INVENTION

Figure 1:
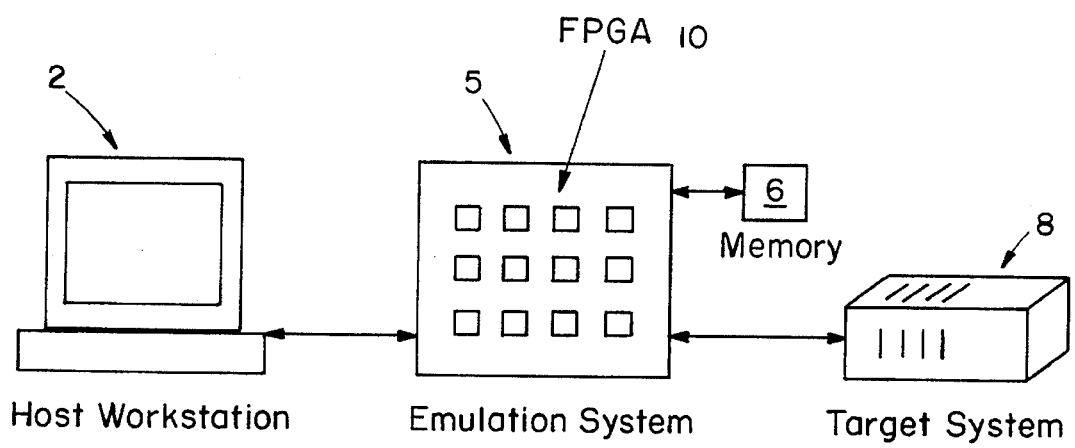
FIG. 1 is a block diagram of a typical prior art logic emulation system.

FIG. 1 is a block diagram of a typical prior art logic emulation system 5. The performance of the system 5 is achieved by partitioning a logic design, described by a netlist, across an interconnected array of FPGAs 10. This array is connected to a host workstation 2 which is capable of downloading design configurations, and is directly wired into the target system 8 for the logic design. Memory elements 6 may also be connected to the array of FPGAs 10. The netlist partition on each FPGA (hereinafter FPGA partition), configured directly into logic circuitry, can then be executed at hardware speeds.

Figure 2:
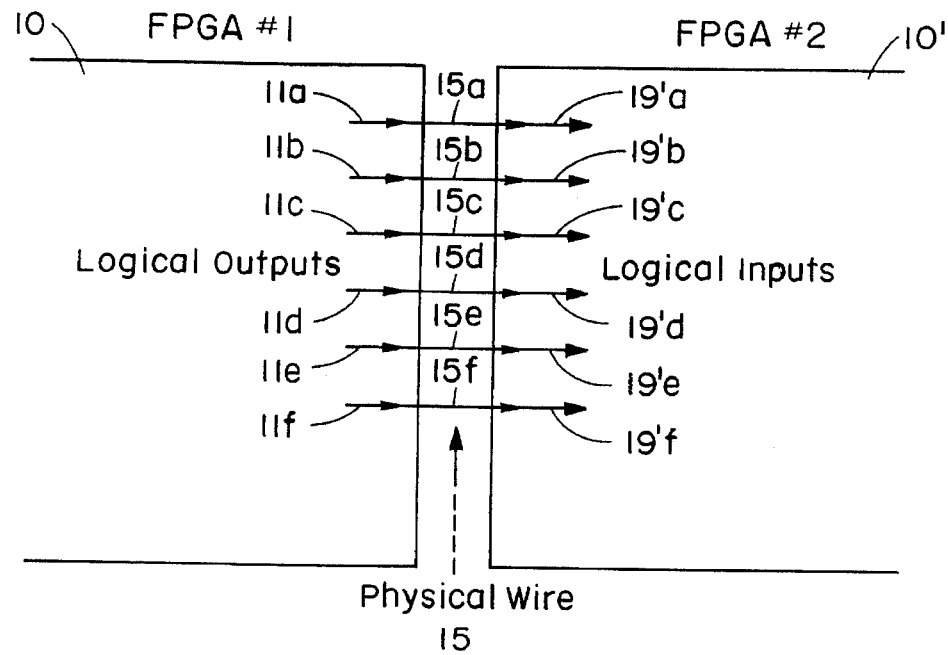
FIG. 2 is a block diagram of a prior art hardwire interconnect system between Field Programmable Gate Arrays (FPGA) 10 of FIG. 1.

In existing architectures, shown in FIG. 2, both the logic configuration and the network connectivity remain fixed for the duration of the emulation. FIGS. 2 shows an example of six logical wires $11a-f$, $19'a-f$ allocated to six physical wires $15a-f$. Each emulated gate is mapped to one FPGA equivalent gate and each emulated signal is allocated to one FPGA pin. Thus, for a partition to be feasible, the partition gate and pin requirements must be no greater that the available FPGA resources. This constraint yields the following possible scenarios for each FPGA partition:

1. Gate limited: no unused gates, but some unused pins.
2. Pin limited: no unused pins, but some unused gates.
3. Not limited: unused FPGA pins and gates.
4. Balanced: no unused pins or gates.

For mapping typical circuits onto available FPGA devices, partitions are predominately pin limited; all available gates cannot be utilized due to a lack of pin resources to support them. Low utilization of gate resources increases both the number of FPGAs 10 needed for emulation and the time required to emulate a particular design. Pin limits set a hard upper bound on the maximum usable gate count any FPGA gate size can provide. This discrepancy will only get worse as technology scales; trends (and geometry) indicate that available gate counts are increasing faster than available pin counts.

Figure 3:
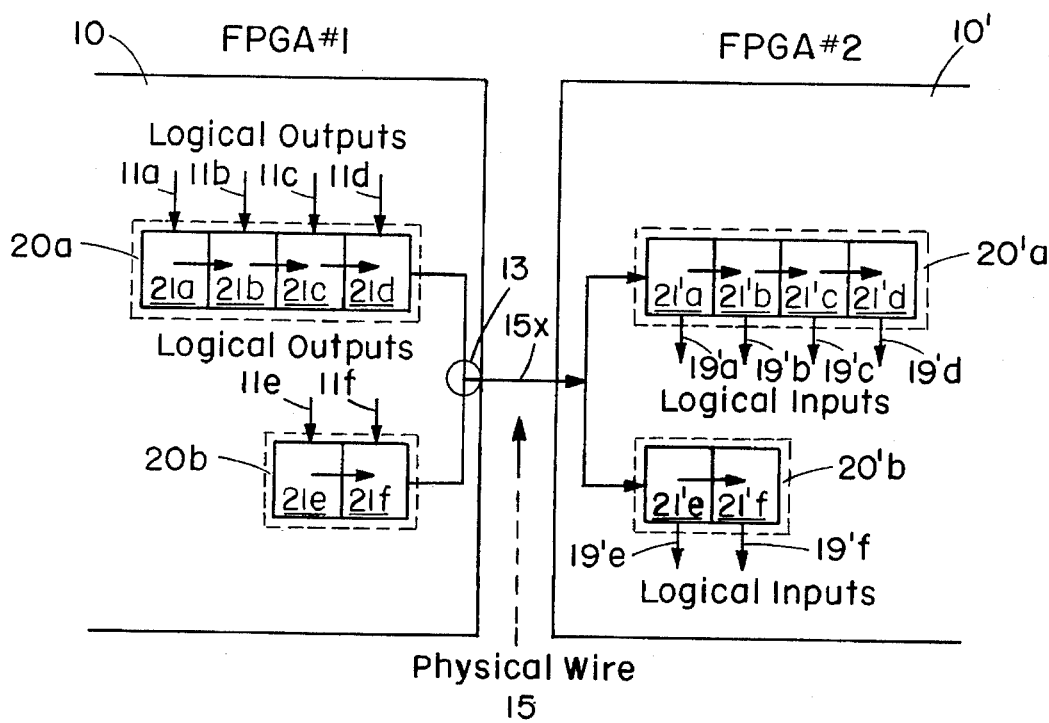
FIG. 3 is a block diagram of a virtual interconnection interconnect system between FPGAs 10 of FIG. 1.

In a preferred embodiment of the invention, shown in FIG. 3, virtual interconnections are used to overcome pin limitations in FPGA-based logic emulators. FIG. 3 shows an example of six logical wires $11a-f$ sharing a single physical wire $15x$. The physical wire $15x$ is multiplexed 13 between two pipelined shift loops $20a$, $20b$, which are discussed in detail below. Pipelining refers to signal streams in a particular phase and multiplexing refers to signals across phases. A virtual interconnection represents a connection between a logical output $11a$ on one FPGA 10 and a logical input $19'a$ on another FPGA 10'. Established via a pipelined, statically routed communication network, these virtual interconnections increase available off-chip communication bandwidth by multiplexing 13 the use of FPGA pin resources (physical wires) 15 among multiple emulation signals (logical wires).

Virtual interconnections effectively relax pin limitations. Although low pin counts may decrease emulation speed, there is not a hard pin constraint that must be enforced. Emulation speed can be increased if there is a large enough reduction in system size. The gate overhead of using virtual interconnections is low, comprising gates that are not utilized in the purely hardwired implementation. Furthermore, the flexibility of virtual interconnections allows the emulation architecture to be balanced for each logic design application.

One to one allocation of emulation signals (logical wires) 11, 19 to FPGA pins (physical wires) 15 does not exploit available off chip bandwidth because emulation clock frequencies are one or two orders of magnitude lower than the potential clocking frequency of the FPGA technology, and all logical wires 11, 19 are not active simultaneously.

By pipelining and multiplexing physical wires 15, virtual interconnections are created to increase usable bandwidth. By clocking physical wires 15 at the maximum frequency of the FPGA technology, several logical connections can share the same physical resource.

In a logic design, evaluation flows from system inputs to system outputs. In a synchronous design with no combinatorial loops, this flow can be represented as a directed acyclic graph. Thus, through intelligent dependency analysis of the underlying logic circuit, logical values between FPGA partitions need to only be transmitted once. Furthermore, because circuit communication is inherently static, communication patterns repeat in a predictable fashion.

In a preferred embodiment of the invention, virtual interconnections are supported with a "softwire" compiler. This compiler analyzes logic signal dependencies and statically schedules and routes FPGA communication. These results are then used to construct (in the FPGA technology) a statically routed network. This hardware consists of a sequencer and shift loops. The sequencer is a distributed finite state machine. The sequencer establishes virtual connections between FPGAs by strobing logical wires in a predetermined order into special shift registers 21, the shift loops 20. The shift loops 20 serve as multiplexers 13 and are described in detail below. Shift loops 20 are then alternately connected to physical wires 15 according to the predetermined schedule established by the sequences.

The use of virtual interconnections is limited to synchronous logic. Any asynchronous signals must still be "hardwired" to dedicated FPGA pins. This limitation is imposed by the inability to statically determine dependencies in asynchronous loops. Furthermore, each combinational loop (such as a flip-flop) in a synchronous design is completely contained in a single FPGA partition. For simplicity and clarity of description, it is assumed that the emulated logic has a single global clock.

In a preferred embodiment of the invention, virtual interconnections are implemented in the context of a complete emulation software system, independent of target FPGA device and interconnect topology. While this embodiment focuses primarily on software, the ultimate goal of the invention is a low-cost, reconfigurable emulation system.

In a preferred embodiment, the signals are routed through each FPGA. This embodiment avoids the use of a crossbar. By routing the signals through each FPGA, speed is increased because there are no long wires connecting the FPGAs to the crossbar.

Figure 4:
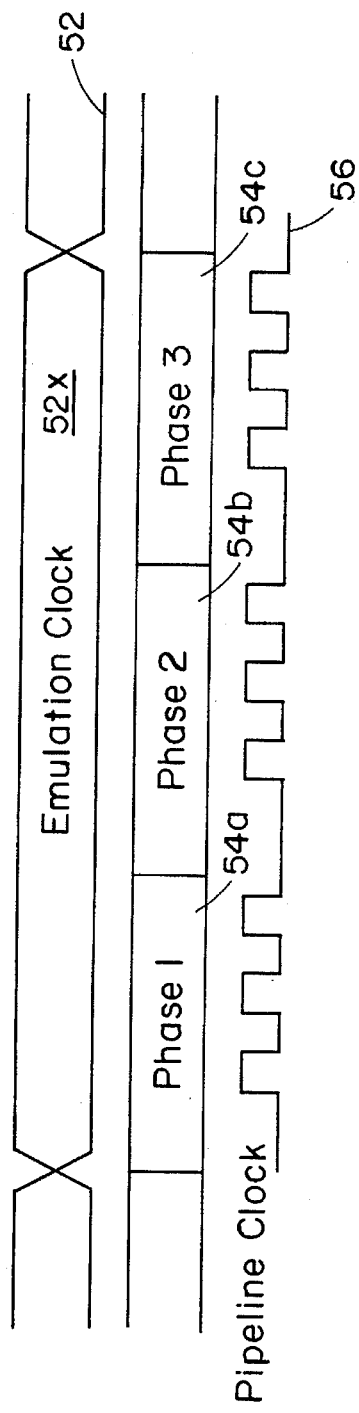
FIG. 4 is a graphical representation of an emulation phase clocking scheme.

FIG. 4 graphically represents an emulation phase clocking scheme. The emulation clock period 52x is the clock period of the logic design being emulated. This clock is broken into evaluation phases (54a, 54b, 54c) to accumulate multiplexing. Multiple phases are required because the combinational logic between flip-flops in the emulated design may be split across multiple FPGA partitions and multiplexing of vertical wires prevents direct pass of all signals through the partitions. The phases permit a single pin to send different logical signals on every phase. Within a phase 54, evaluation is accomplished within each partition, and the results are then communicated to other FPGA partitions. Although three phases are illustrated per emulation period, it will be understood that more or less phases can be employed.

At the beginning of the phase 54, logical outputs of each FPGA partition are determined by the logical inputs in input shift loops. At the end of the phase 54, outputs are then sent to other FPGA partitions with pipelined shift loops and intermediate hop stages. As illustrated in FIG. 4, these pipelines are clocked with a pipeline clock 56 at the maximum frequency of the FPGA. After all phases 54 within an emulation clock period 52x are complete, the emulation clock 52 is ticked to clock all flip-flops of the target circuit.

Figure 5:
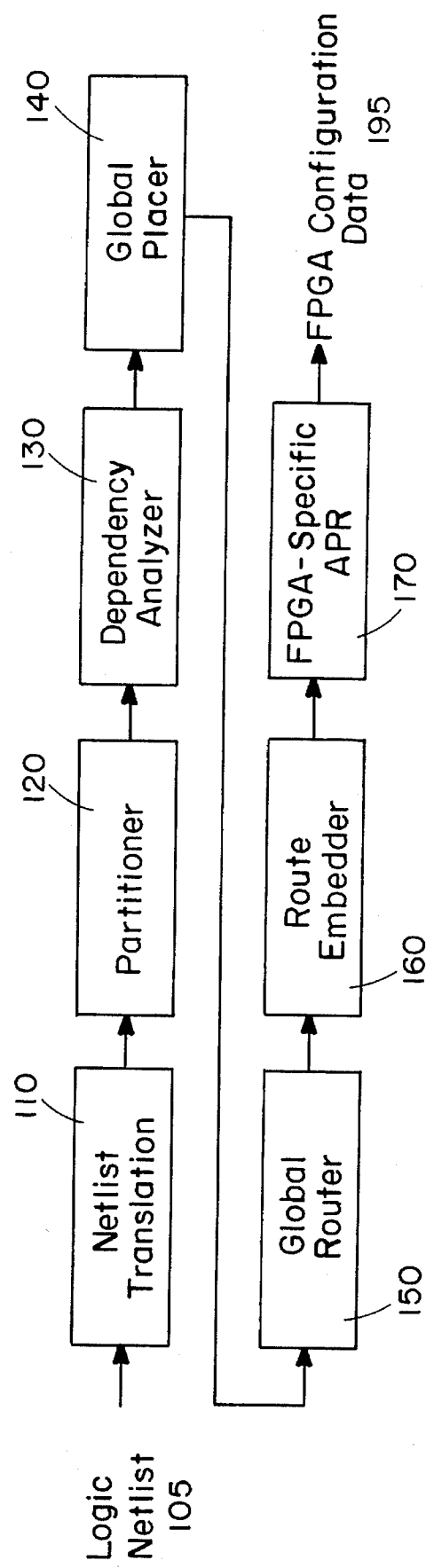
FIG. 5 is a flowchart of a preferred software compiler.

The input to the softwire compiler consists of a netlist 105 of the logic design to be emulated, target FPGA device characteristics, and interconnect topology. The compiler then produces a configuration bitstream that can be downloaded into the emulator. FIG. 5 is a flowchart of the compilation steps. Briefly, these steps include translation and mapping of the netlist to the target FPGA technology (step 110), partitioning the netlist (step 120), placing the partitions into interconnect topology (steps 130, 140), routing the inter-node communication paths (steps 150, 160), and finally FPGA-specific automated placement and routing (APR) (step 170).

The input netlist 105 to be emulated is usually generated with a hardware description language or schematic capture program. This netlist 105 must be translated and mapped (step 110) to a library of FPGA macros. It is important to perform this operation before partitioning so that partition gate counts accurately reflect the characteristics of the target FPGAs. Logic optimization tools can also be used at this point to optimize the netlist for the target architecture (considering the system as one large FPGA).

After mapping (step 110) the netlist to the target architecture, the netlist must be partitioned (step 120) into logic blocks that can fit into the target FPGA. With only hardwires, each partition must have both fewer gates and fewer pins than the target device. With virtual interconnections, the total gate count (logic gates and virtual wiring overhead) must be no greater than the target FPGA gate count. A preferred embodiment uses the Concept Silicon partitioner manufactured by INCA, Inc. This partitioner performs K-way partitioning with min-cut and clustering techniques to minimize partition pin counts.

Because a combinatorial signal may pass through several FPGA partitions during an emulated clock cycle, all signals will not be ready to schedule at the same time. A preferred embodiment solves this problem by only scheduling a partition output once all the inputs it depends upon are scheduled (step 130). An output depends on an input if a change in that input can change the output. To determine input to output dependencies, the logic netlist is analyzed, backtracing from partition outputs to determine which partition inputs they depend upon. In backtracing, it is assumed that all outputs depend on all inputs for gate library parts, and no outputs depend on any inputs for latch (or register) library parts. If there are no combinatorial loops that cross partition boundaries, this analysis produces a directed acyclic graph, the signal flow graph (SFC), to be used by the global router.

Following logic partitioning, individual FPGA partitions must be placed into specific FPGAs (step 140). An ideal placement minimizes system communication, thus requiring fewer virtual interconnection cycles to transfer information. A preferred embodiment first makes a random placement followed by cost-reduction swaps, and then further optimize with simulated annealing.

During global routing (150), each logical wire is scheduled to a phase, and assigned a pipeline time slot (corresponding to one cycle of the pipeline clock in that phase on a physical wire). Before scheduling, the criticality of each logical wire is determined (based on the signal flow graph produced by dependency analysis). In each phase, the router first determines the schedulable wires. A wire is schedulable if all wires it depends upon have been scheduled in previous phases. The router than uses shortest path analysis with a cost function based on pin utilization to route as many schedulable signals as possible, routing the most critical signals first. Any schedulable signals which cannot be routed are delayed to the next phase.

Once routing is completed, appropriately-sized shift loops and associated logic are added to each partition to complete the internal FPGA hardware description (step 160). At this point, there is one netlist for each FPGA. These netlists are then be processed with the vendor-specific FPGA place and route software (step 170) to produce configuration bitstreams (step 195).

Technically, there is no required hardware support for implementation of virtual interconnections (unless one considers re-designing an FPGA optimized for virtual wiring). The necessary "hardware" is compiled directly into configuration for the FPGA device. Thus, any existing FPGA-based logic emulation system can take advantage of virtual wiring. Virtual interconnections can be used to store and retrieve data from memory elements external to the FPGAs by multiplexing the data on the virtual interconnections during a phase. There are many possible ways to implement the hardware support for virtual interconnections. A preferred embodiment employs a simple and efficient implementation. The additional logic to support virtual interconnections can be composed entirely of shift loops and a small amount of phase control logic.

Figure 6:
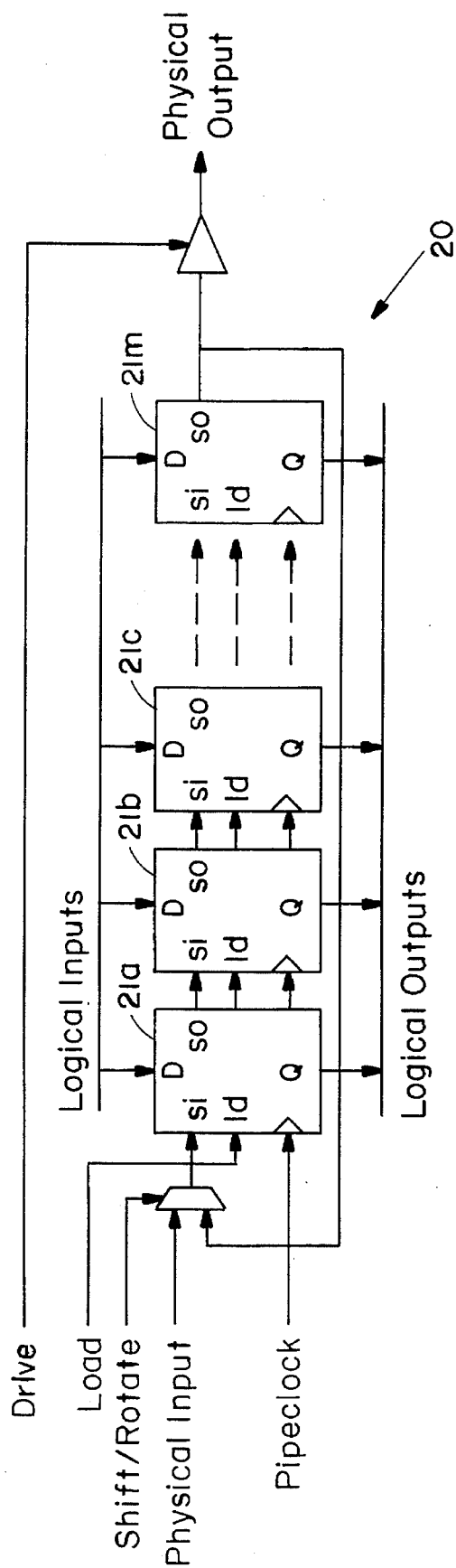
FIG. 6 is a block diagram of a preferred shift register or shift loop architecture.

FIG. 6 is a block diagram of a preferred shift loop architecture. A shift loop 20 is a circular, loadable shift register with enabled shift in and shift out ports. Each shift register 21 is capable of performing one or more of the operations of load, store, shift, drive, or rotate. The Load operation strobes logical outputs into the shift loop. The Store operation drives logical inputs from the shift loop. The Shift operation shifts data from a physical input into the shift loop. The Drive operation drives a physical output with the last bit of the shift loop. The Rotate operation rotates bits in the shift loop. In a preferred embodiment, all outputs loaded into a shift loop 20 must have the same final destination FPGA. As described above, a logical output can be strobed once all corresponding depend inputs have been stored. The purpose of rotation is to preserve inputs which have reached their final destination and to eliminate the need for empty gaps in the pipeline when shift loop lengths do not exactly match phase cycle counts. In this way, a signal may be rotated from the shift loop output back to the shift loop input to wait for an appropriate phase. Note that in this implementation the store operation cannot be disabled.

Shift loops 20 can be re-scheduled to perform multiple output operations. However, because the internal latches being emulated depend on the logical inputs, inputs need to be stored until the tick of the emulation clock.

Figure 7:
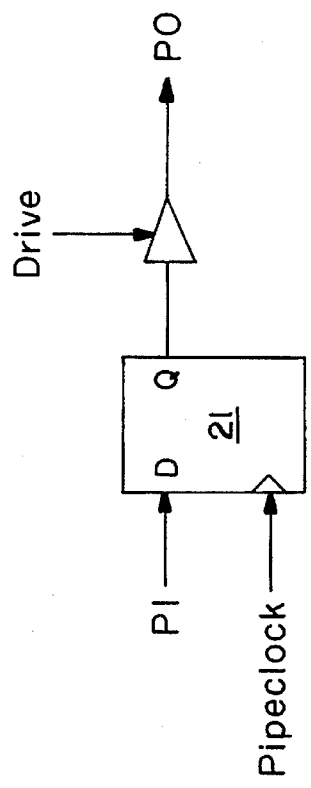
FIG. 7 is a block diagram of the intermediate hop, single bit, pipeline stage of FIG. 6.

For networks where multiple hops are required (i.e. a mesh), one bit shift registers 21 that always shift and sometimes drive are used for intermediate stages. FIG. 7 is a block diagram of the intermediate hop pipeline stage. These stages are chained together, one per FPGA hop, to build a pipeline connecting the output shift loop on the source FPGA 10 with the input shift loop on the destination FPGA 10'.

The phase control logic is the basic run-time kernel in a preferred embodiment. This kernel is a sequencer that controls the phase enable and strobe (or load) lines, the pipeline clock, and the emulation clock. The phase enable lines are used to enable shift loop to FPGA pin connections. The phase strobe lines strobe the shift on the correct phases. This logic is generated with a state machine specifically optimized for a given phase specification.

EXPERIMENTAL RESULTS

The system compiler described above was implemented by developing a dependency analyzer, global placer, global router, and using the InCA partitioner. Except for the partitioner, which can take hours to optimize a complex design, running times on a SPARC 2 workstation were usually 1 to 15 minutes for each stage.

To evaluate the costs and benefits of virtual interconnections, two complex designs were compiled, SPARCLE and the A-1000. SPARCLE is an 18K gate SPARC microprocessor enhanced with multiprocessing features. The Alewife compiler and memory management unit (A-1000) is an 86K gate cache compiler for the Alewife Multiprocessor, a distributed shared memory machine being designed at the Massachusetts Institute of Technology. For target FPGAs, the Xilinx 3000 and 4000 series (including the new 4000H series) and the Concurrent Logic Cli6000 series were considered. This analysis does not include the final FPGA-specific APR stage; a 50 percent APR mapping efficiency for both architectures is assumed.

In the following analysis, the FPGA gate costs of virtual interconnections based on the Concurrent Logic CLI6000 series FPGA were estimated. The phase control logic was assumed to be 300 gates (after mapping). Virtual interconnection overhead can be measured in terms of shift loops. In the Cli6000, a bit stage shift register takes 1 of 3136 cells in the 5K gate part ($C_s$=3 mapped gates). Thus, total required shift register bits for a partition is then equal to the number of inputs. When routing in a mesh or torus, intermediate hops cost 1 bit per hop. The gate overhead is then $C_s \times S$, where $C_s$ is the cost of a shift register bit, and S is the number of bits. S is determined by the number of logical inputs, $V_i$, and $M_p$, the number of times a physical wire p is multiplexed (this takes into account the shift loop tristate driver and the intermediate hop bits). Gate overhead is then approximately:

$$Gate_{vw} = C_s \times (V_i + \Sigma_p M_p),$$

Storage of logical outputs is not counted because logical outputs can be overlapped with logical inputs.

Figure 8:
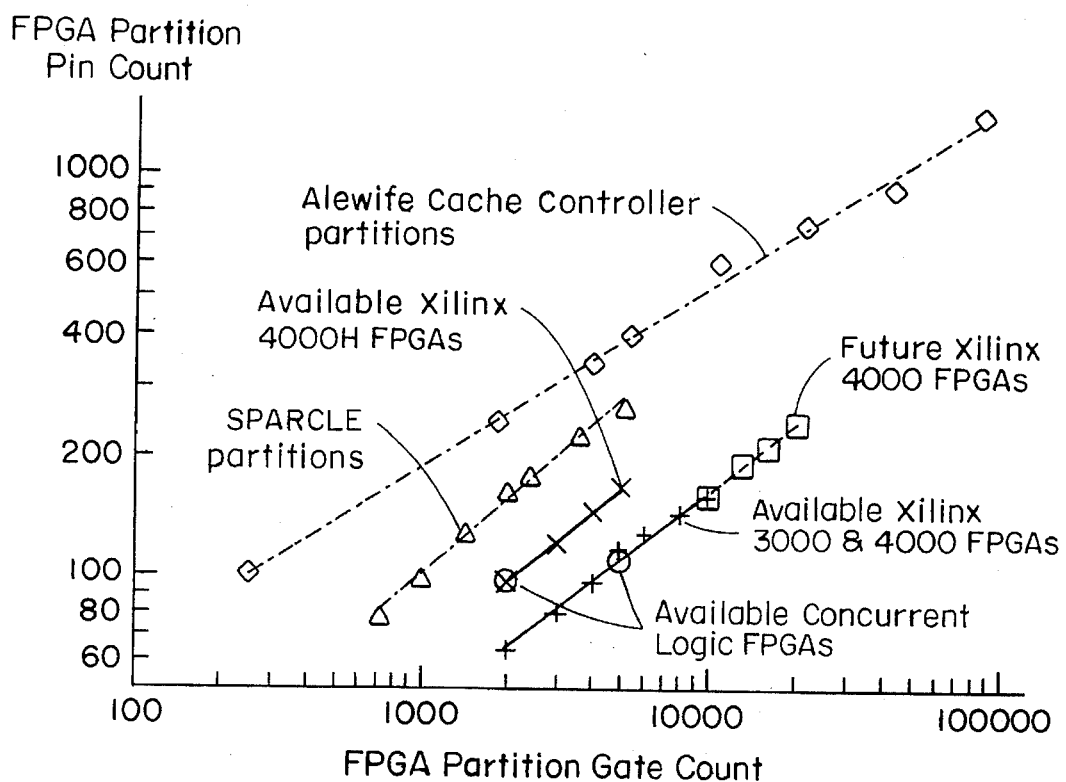
FIG. 8 is a graph illustrating pin count as a function of FPGA partition size.

Before compiling the two test designs, their communication requirements were compared to the available FPGA technologies. For this comparison, each design was partitioned for various gate counts and the pin requirements were measured. FIG. 8 shows the resulting curves, plotted on a log-log scale. Note that the partition gate count is scaled to represent mapping inefficiency.

Both design curves and the technology curves fit Rent's Rule, a rule of thumb used for estimating communication requirement in random logic. Rent's Rule can be stated as:

$$pins_2/pins_1 = (gates_2/gates_1)^b,$$

where $pins_2$, $gates_2$ refer to a partition, and $pins_1$, $gates_1$ refer to a sub-partition, and b is constant between 0.4 and 0.7. Table 1 shows the resulting constants. For the technology curve, a constant of 0.5 roughly corresponds to the area versus perimeter for the FPGA die. The lower the constant, the more locality there is within the circuit. Thus, the A-1000 has more locality than SPARCLE, although it has more total communication requirements. As FIG. 8 illustrates, both SPARCLE and the A-1000 will be pin-limited for any choice of FPGA size. In hardwired designs with pin-limited partition sizes, usable gate count is determined solely by available pin resources. For example, a 5000 gate FPGA with 100 pins can only utilize 1000 SPARCLE gates or 250 A-1000 gates.

TABLE 1

Rent's Rule Parameter (slope of log-log curve)

| FPGA Technology | SPARCLE | A-1000 |
| --- | --- | --- |
| 0.50 | 0.06 | 0.44 |

Next, both designs were compiled for a two dimensional torus and a full crossbar interconnect of 5000 gate, 100 pin FPGAs, 50 percent mapping efficiency. Table 2 shows the results for both hard wires and virtual interconnections. Compiling the A-1000 to a torus, hardwires only, was not practical with the partitioning software. The gate utilizations obtained for the hardwired cases agree with

TABLE 2

Number of 5K Gates, 100 Pin FPG
As Required for Logic Emulation

| | Hardwires Only | | Virtual interconnections Wires Only | |
| --- | --- | --- | --- | --- |
| Design | 2-D Torus | Full Crossbar | 2-D Torus | Full Crossbar |
| Sparcle (18K gates) | >100 (<7%) | 31 (23%) | 9 (80%) | 9 (80%) |
| A-1000 (86K gates) | Not Practical | >400 (<10%) | 49 (71%) | 42 (83%) |

Figure 9:
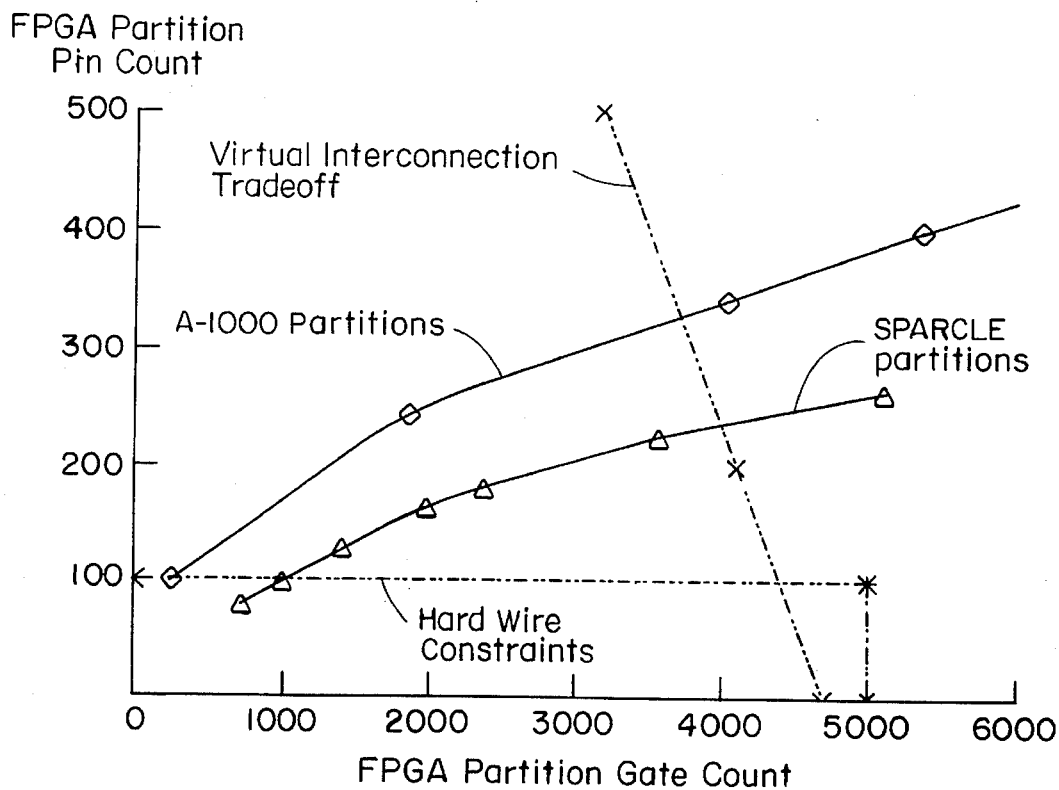
FIG. 9 is a graph illustrating a determination of optimal partition size.

Number of FPGAs (Average Usable Gate Utilization)

reports in the literature on designs of similar complexity. To understand the tradeoffs involved, the hardwires pin/gate constraint and the virtual interconnections pin/gate tradeoff curve were plotted against the partition curves for the two designs (FIG. 9). The intersection of the partition curves and the wire curves gives the optimal partition and sizes. This graph shows how virtual interconnections add the flexibility of trading gate resources for pin resources.

Emulation clock cycle time $T_E$ is determined by:

1. Communication delay per hop, $t_c$;
2. Length of longest path in dependency graph L;
3. Total FPGA gate delay along longest path $T_{Li}$;
4. Sum of pipeline cycles across all phases, n;
5. Network diameter, D (D=1 for crossbar); and
6. Average network distance, $k_d$ ($k_d$=1 for crossbar).

The total number of phases and pipeline cycles in each phase are directly related to physical wire contention and the combinatorial path that passes through the largest number of partitions. If the emulation is latency dominated, then the optimal number of phases is L, and the pipeline cycles per phase should be no greater than D, giving:

$n = L \times D$.

If the emulation is bandwidth dominated, then the total pipeline cycles (summed over all phases) is at least:

$n = MAX_p[(Vi_p/Pi_p)]$ where $Vi_p$ and $Pi_p$ are the number of virtual and physical wires for FPGA partition p. If there are hot spots in the network (not possible with a crossbar), the bandwidth dominated delay will be higher. Emulation speeds for SPARCLE and the A-1000 were both latency dominated.

Based on CLi6000 specifications, it was assumed that $T_L$=250 ns and $t_c$=20 ns (based on a 50 MHZ clock). A computation-only delay component, and a communication-only delay component were considered. This dichotomy is used to give a lower and upper bound on emulation speed.

The computation-only delay component is given by:

$T_p = T_L + t_c \times n$, where n=0 for the hardwired case.

The communication-only delay component is given by:

$T_c = t_c \times n$.

Table 3 shows the resulting emulation speeds for virtual and hardwires for the crossbar topology. The emulation clock range given is based on the sum and minimum of the two components (lower and upper bounds). When the use of virtual interconnections allows a design to be partitioned across fewer FPGAs, L is decreased, decreasing $T_c$. However, the pipeline stages will increase $T_p$ by $t_c$ per pipeline cycle.

TABLE 3

Emulation Clock Speed Comparison

| | | Hardwire Only | Virtual Wire Only |
| --- | --- | --- | --- |
| SPARCLE | Longest Path | 9 hops | 6 hops |
| | Computation Only Delay | 250 ns | 370 ns |
| | Communication Only Delay | 180 ns | 120 ns |
| | Emulation Clock Range | 2.3–5.6 MHZ | 2.0–8.3 MHz |
| A-1000 | Longest Path | 27 hops | 17 hops |
| | Computation Only Delay | 250 ns | 590 ns |
| | Communication Only Delay | 540 ns | 340 ns |
| | Emulation Clock Range | 1.3–4.0 MHz | 1.1–2.9 MHz |

Figure 10:
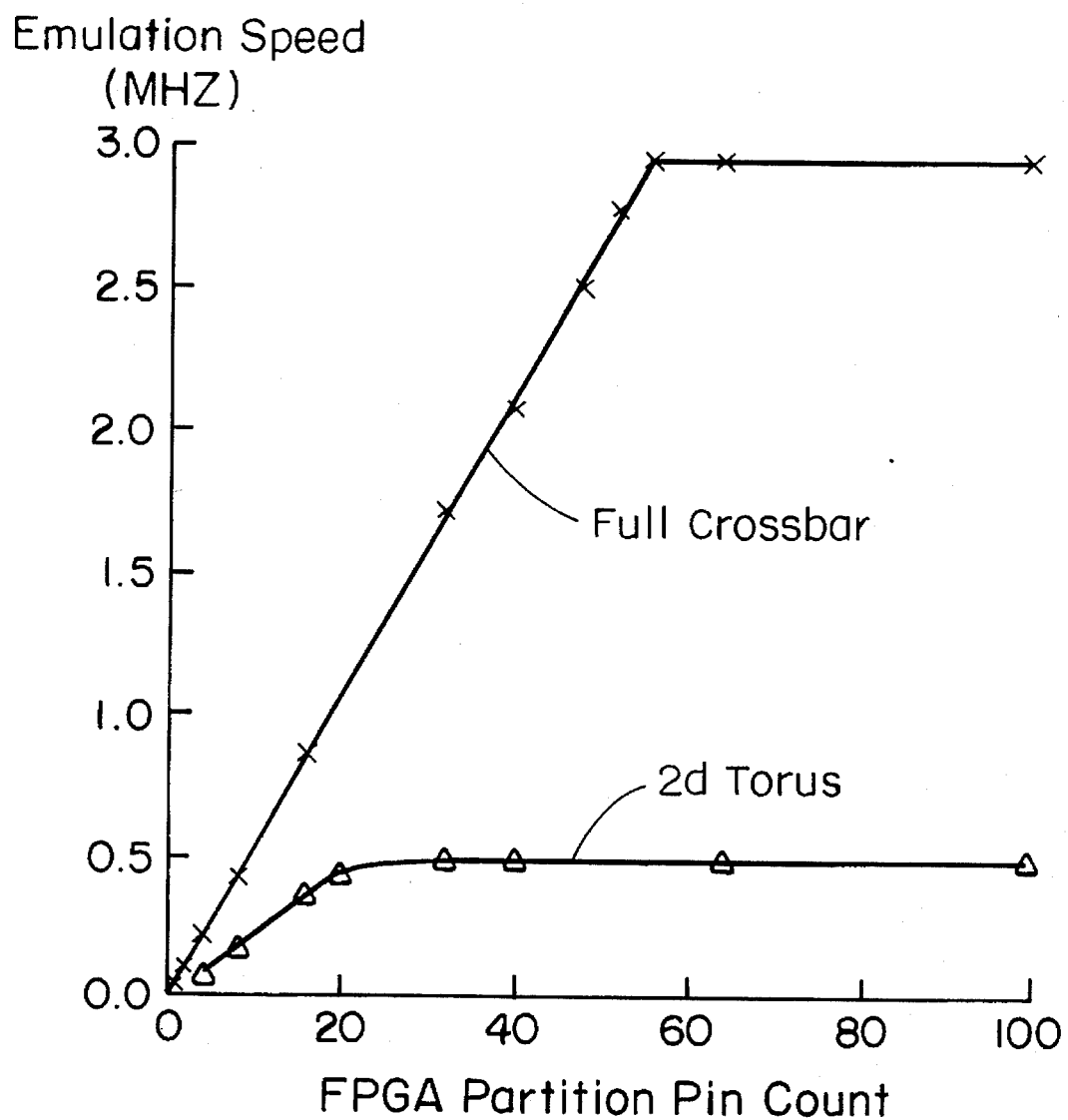
FIG. 10 is a graph illustrating emulation speed vs. pin count for a torus and a crossbar configuration.

In Table 3, the virtual interconnection emulation clock was determined solely by the length of the longest path; the communication was limited by latency, not bandwidth. To determine what happens when the design becomes bandwidth limited, the pin count was varied and the resulting emulation clock (based on $T_c$) was recorded for both a crossbar and torus topology. FIG. 10 shows the results for the A-1000. The knee of the curve is where the latency switches from bandwidth dominated to latency dominated. The torus is slower because it has a larger diameter, D. However, the torus moves out of the latency dominated region sooner because it exploits locality; several short wires can be routed during the time of a single long wire. Note that this analysis assumes the crossbar can be clocked as fast as the torus; the increase in emulation speed obtained with the crossbar is lower if $t_c$ is adjusted accordingly.

With virtual interconnections, neither designs was bandwidth limited, but rather limited by its respective critical paths. As shown in FIG. 10, the A-1000 needs only about 20 pins per FPGA to run at the maximum emulation frequency. While this allows the use of lower pin count (and thus cheaper) FPGAs, another option is to trade this surplus bandwidth for speed. This tradeoff is accomplished by hardwiring logical wires at both ends of the critical paths. Critical wires can be hardwired until there is no more surplus bandwidth, thus fully utilizing both gate and pin resources. For designs on the 100 pin FPGAs, hardwiring reduces the longest critical path from 6 to 3 for SPARCLE and from 17 to 15 for the A-1000.

Virtual interconnections allow maximum utilization of FPGA gate resources at emulation speeds competitive with existing hardwired techniques. This technique is independent of topology. Virtual interconnections allow the use of less complex topologies, such as a torus instead of a crossbar, in cases where such a topology was not practical otherwise.

Using timing and/or locality sensitive partitioning with virtual interconnections has potential for reducing the required number of routing sub-cycles. Communication bandwidth can be further increased with pipeline compaction, a technique for overlapping the start and end of long virtual paths with shorter paths traveling in the same direction. A more robust implementation of virtual interconnections replaces the global barrier imposed by routing phases with a finer granularity of communication scheduling, possible overlapping computation and communication as well.

Using the information gained from dependency analysis, one can now predict which portions of the design are active during which parts of the emulation clock cycle. If the FPGA device supports fast partial reconfiguration, this information can be used to implement virtual logic via invocation of hardware subroutines. An even more ambitious direction is event-driven emulation—only send signals which change, only activate (configure) logic when it is needed.

EQUIVALENTS

Those skilled in the art will know, or be able to ascertain using no more than routine experimentation, many equivalents to the specific embodiments of the invention described herein.

These and all other equivalents are intended to be encompassed by the following claims.

The invention claimed is:

1. A reconfigurable electronic system comprising:
   a plurality of reprogrammable logic modules, each logic module having a plurality of pins for communicating signals between logic modules;
   inter-module connections between pins of different logic modules; and
   a configurer to configure each logic module to define a partition of a specified target circuit with interconnections between the partitions of the target circuit being provided through pins and inter-module connections, a partition of the configured target circuit having a number of interconnections to other partitions that exceeds the number of pins on the logic module and the logic module being configured to communicate through virtual interconnections in a time-multiplexed fashion through at least one pin, the inter-module communications including interconnections which extend through intermediate reconfigurable logic modules.

2. A system as claimed in claim 1 wherein the configurer configures a logic module to form a multiplexer for communicating through virtual interconnections.

3. A system as claimed in claim 1 wherein pins of logic modules are directly connected to pins of other logic modules and routing of signals between the logic modules is through intermediate logic modules.

4. A system as claimed in claim 1 wherein the logic modules comprise hardwired multiplexers.

5. A system as claimed in claim 1 wherein the logic modules are configured to operate in phases within a target clock period with inter-module communications being performed within each phase.

6. A system as claimed in claim 5 wherein the configurer optimizes logic module selection and phase division of the target circuit based on interpartition dependencies.

7. A system as claimed in claim 6 wherein the target clock period dictates the maximum rate at which signal lines of the target circuit change value and wherein each target clock period comprises a plurality of system clock periods which dictate the maximum rate at which signals in the electronic system change value.

8. The system as claimed in claim 7 wherein each system clock period is scheduled to either perform a computation or carry a communication signal during a particular target clock period.

9. The system as claimed in claim 6 wherein a physical intermodule pin carries a plurality of target system signals during a target system clock period, each target system signal being carried during a system clock period.

10. A system as claimed in claim 1 wherein data is accessed from memory elements external to the logic modules.

11. The system as claimed in claim 10 wherein memory data is multiplexed on virtual interconnections.

12. A system as claimed in claim 1 wherein the logic modules are Field Programmable Gate Arrays (FPGAs).

13. A system as claimed in claim 1 wherein the system is an emulation system for emulating the target circuit.

14. A system as claimed in claim 1 wherein each logic module comprises an array of interconnected programmable logic cells.

15. A system as claimed in claim 1 wherein each module is a single chip.

16. A system as claimed in claim 1 wherein logic modules are configured to include pins dedicated to individual signals.

17. A system as claimed in claim 16 wherein an individual signal is on a critical signal path.

18. A system as claimed in claim 16, including asynchronous logic hardwired to dedicated pins of the logic modules.

19. A system as claimed in claim 16 wherein each dedicated pin is a surplus pin not configured by the configurer as a virtual interconnection.

20. A system as claimed in claim 1 wherein the configurer comprises a partitioner that partitions the target logic circuit, each partition being configured into a respective logic module.

21. A system as claimed in claim 20 further comprising a dependency analyzer and a divider, a target clock period being divided into phases during which program logic functions are performed and signals are transmitted between the logic modules, the phase division being a function of partition dependencies and memory assignments.

22. A system as claimed in claim 20 further comprising a router that configures the logic modules to route signals between logic modules through intermediate logic modules.

23. A system as claimed in claim 1 wherein the configurer provides pipeline compaction by overlapping a first virtual path with a plurality of second virtual paths traveling in the same direction.

24. A system as claimed in claim 1 wherein the configurer configures virtual logic by reconfiguring a portion of the logic module during periods of inactivity for the portion of the logic module.

25. A system as claimed in claim 1 wherein the configuration of the logic modules is event driven such that pins only communicate signals which have changed in value.

26. A logic system as claimed in claim 1 wherein at least one intermodule logic module includes a register corresponding to a signal being routed.

27. A compiler for programming a reconfigurable electronic system comprising:

a partitioner that partitions a target logic circuit into partitions to be configured into individual logic modules;

a configurer to configure each logic module to create a partition of the target circuit with virtual interconnections between partitions of the target circuit corresponding to at least one common pin with signals along the virtual interconnections being time-multiplexed through common pins; and a router to configure the logic modules to route signals between logic modules through intermediate logic modules.

28. A compiler as claimed in claim 27 further comprising a dependency analyzer and a divider that divides a target clock period into phases during which program logic functions are performed and signals are transmitted between the logic modules, the phase division being a function of partition dependencies and memory assignments.

29. A compiler as claimed in claim 27 wherein the logic modules are Field Programmable Gate Arrays (FPGAs).

30. A compiler as claimed in claim 27 wherein the system is a logic emulation system and the target circuit is being emulated by the logic emulation system.

31. A compiler as claimed in claim 27 wherein the configurer configures intermediate logic modules to form at least one topology from the group consisting of crossbar, mesh and torus.

32. A method of compiling a reconfigurable electronic system, comprising the steps of:

partitioning a target circuit into a plurality of partitions, each partition to be configured into an individual logic module having a plurality of pins;

configuring each logic module to create a partition of the target circuit with virtual interconnections between partitions corresponding to at least one common pin with signals along the virtual interconnections being time-multiplexed through the at least one common pin; and configuring the logic modules to route signals between logic modules through intermediate logic modules.

33. A method as claimed in claim 32 further comprising the step of dividing a first clock period which dictates the maximum rate at which signal lines within the target circuit change value into phases during which program logic functions are performed and signals are transmitted between logic modules.

34. A reconfigurable electronic system comprising:

a plurality of reprogrammable logic modules, each logic module having a plurality of pins for communicating signals between logic modules;

inter-module connections between pins of different logic modules; and a configurer to configure each logic module to define a partition of a specified target circuit with interconnections between the partitions of the target circuit being provided through pins and inter-module connections, a partition of the configured target circuit having a number of interconnections to other partitions that exceeds the number of pins on the logic module and the logic module being configured to communicate through virtual interconnections in a time-multiplexed fashion through at least one pin, the electronic system including dedicated pins for providing a predetermined signal.

35. A system as claimed in claim 34 wherein the predetermined signal is on a critical signal path.

36. A system as claimed in claim 34, including asynchronous logic hardwired to dedicated pins of the logic modules.

37. A system as claimed in claim 34 wherein each dedicated pin is a surplus pin not configured by the configurer as a virtual interconnection.

38. A system as claimed in claim 34 wherein the logic modules are configured to operate in phases within a target clock period with inter-module communications being performed within each phase.

39. A system as claimed in claim 34 wherein data is accessed from memory elements external to the logic modules.

40. A logic system as claimed in claim 34 wherein the logic modules are Field Programmable Gate Arrays (FPGAs).

41. A system as claimed in claim 34 wherein the system is an emulation system for emulating the target circuit.

42. A system as claimed in claim 34 wherein each module is a single chip.

* * * * *

(12) EX PARTE REEXAMINATION CERTIFICATE (5625th)
United States Patent
Agarwal et al.

(10) Number: US 5,596,742 C1
(45) Certificate Issued: Dec. 5, 2006

(54) VIRTUAL INTERCONNECTIONS FOR RECONFIGURABLE LOGIC SYSTEMS

(75) Inventors: Anant Agarwal, Framingham, MA (US); Jonathan Babb, Ringgold, GA (US); Russell Tessier, Cambridge, MA (US)

(73) Assignee: The United States of America as represented by the Secretary of the Navy, Washington, DC (US)

Reexamination Request:
No. 90/006,985, Mar. 30, 2004

Reexamination Certificate for:
Patent No.: 5,596,742
Issued: Jan. 21, 1997
Appl. No.: 08/042,151
Filed: Apr. 2, 1993

(51) Int. Cl.
*G06F 17/50* (2006.01)
*H03K 19/173* (2006.01)

(52) U.S. Cl. .............. 716/16; 716/17; 716/18; 716/1; 326/37; 326/38; 326/39; 326/41

(58) Field of Classification Search .......... 716/16, 716/17, 18, 1
See application file for complete search history.

(56) References Cited

U.S. PATENT DOCUMENTS

| | | | |
|---|---|---|---|
| 4,409,683 A | 10/1983 | Woodward |
| 4,670,749 A | 6/1987 | Freeman |
| 4,697,241 A | 9/1987 | Lavi |
| 4,706,216 A | 11/1987 | Carter |
| 4,709,173 A | 11/1987 | Nishimichi et al. |
| 4,717,912 A | 1/1988 | Harvey et al. |
| 4,721,868 A | 1/1988 | Cornell et al. |
| 4,724,379 A | 2/1988 | Hoffman |
| 4,725,835 A | 2/1988 | Schreiner et al. |
| 4,742,252 A | 5/1988 | Agrawal |
| 4,744,084 A | 5/1988 | Beck et al. |
| 4,746,855 A | 5/1988 | Wrinn |
| 4,751,637 A | 6/1988 | Catlin |
| 4,758,747 A | 7/1988 | Young et al. |
| 4,896,296 A | 1/1990 | Turner et al. |
| 4,910,417 A | 3/1990 | El Gamal et al. |
| 4,914,612 A | 4/1990 | Beece et al. |
| 4,926,423 A | 5/1990 | Zukowski |
| 4,987,319 A | 1/1991 | Kawana |
| 4,992,679 A | 2/1991 | Takata et al. |
| 4,992,680 A | 2/1991 | Benedetti et al. |
| 5,017,813 A | 5/1991 | Galbraith et al. |
| 5,036,473 A | 7/1991 | Butts et al. |
| 5,081,375 A | 1/1992 | Pickett et al. |
| 5,093,920 A | 3/1992 | Agrawal et al. |
| 5,111,455 A | 5/1992 | Negus |
| 5,140,193 A | 8/1992 | Freeman et al. |
| 5,144,166 A | 9/1992 | Camarota et al. |
| 5,155,389 A | 10/1992 | Furtek |
| 5,237,218 A | 8/1993 | Josephson et al. |
| 5,761,484 A | 6/1998 | Agarwal et al. |

OTHER PUBLICATIONS

J. Babb et al., Logic Emulation with Virtual Wires, IEEE Transactions on Computer–Aided Design of Integrated Circuits and Systems, pp. 609–626, Jun. 1997.*

J. Babb et al., Virtual Wires: Overcoming Pin Limitations in FPGA–based Logic Emulators, IEEE Workshop on FPGAs for Custom Computing Machines, pp. 142–151, Apr. 1993.*

(Continued)

*Primary Examiner*—A. M. Thompson

(57) ABSTRACT

A compilation technique overcomes device pin limitations using virtual interconnections. Virtual interconnections overcome pin limitations by intelligently multiplexing each physical wire among multiple logical wires and pipelining these connections at the maximum clocking frequency. Virtual interconnections increase usable bandwidth and relax the absolute limits imposed on gate utilization in logic emulation systems employing Field Programmable Gate Arrays (FPGAs). A "softwire" compiler utilizes static routing and relies on minimal hardware support. The technique can be applied to any topology and FPGA device.

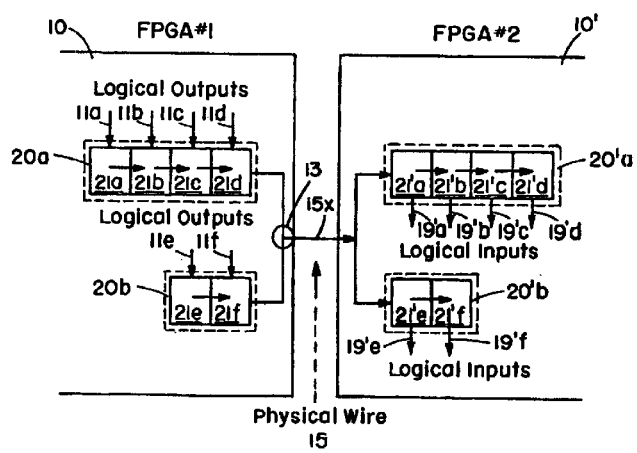

OTHER PUBLICATIONS

W-J Fang et al., Module Generation of Complex Macros for Logic-Emulation Applications, Proceedings of the 1997 ACM Fifth International Symposium of Field-programmable Gate Arrays, pp. 69–75, Feb. 1997.*

S. Walters, Computer-Aided Prototyping for ASIC-Based Systems, IEEE Design & Test of Computers, pp. 4–10, Jun. 1991.*

D. Buell, *Sorting On Splash 2*, Technical Report SRC-TR-92-078, Supercomputing Research Center Institute For Defense Analyses, Sep. 29, 1992.

A. Kopser, *Splash II: Architectural Motivation*, Sep. 17, 1991.

D. Buell et al., *Splash 2: FPGAs In A Custom Computing Machine*, 1996, IEEE Computer Society Press, Los Alamitos, California.

J. Arnold et al., *Splash 2 Programmer's Manual*, Sep. 1, 1993, Version 1.0, SRC-TR-93-107, IDA Supercomputing Research Center, 17100 Science Drive, Bowie, MD 20715.

J. Arnold, *Splash 2 Programmer's Manual*, Dec. 23, 1992, Version 0.7, IDA Supercomputing Research Center, 17100 Science Drive, Bowie, MD 20715.

D. Buell, *A Splash 2 Tutorial*, Dec. 14, 1992, Version 1.1, Technical Report SRC-TR-92-087, IDA Supercomputing Research Center, 17100 Science Drive, Bowie, MD 20715.

D. Buell et al., *A Splash 2 Tutorial*, Sep. 10, 1993, Version 1.3, Technical Report SRC-TR-92-087 (Revised), IDA Supercomputing Research Center, 17100 Science Drive, Bowie, MD 20715.

J. Arnold et al., *VHDL Programming On Splash 2*, 1994, pp. 182–191, IDA Supercomputing Research Center, 17100 Science Drive, Bowie, MD 20715.

Y. Lavi, *The Supersim: An Ultrafast Hardware Logic Simulator*, Jun. 6–9, 1987, IFIP Workshop on CAD Engines, Tokyo.

R. Gupta et al., *System-Level Synthesis Using Re-programmable Components*, Mar. 1992, Center for Integrated Systems, Stanford University, Stanford, CA 94305.

N. Bronson et al., *Congruential Sieves on FPGA Computers*, 1994, Proceedings of Symposia in Applied Mathematics, vol. 48, American Mathematical Society, Providence, Rhode Island.

M. Denneau, *The Yorktown Simulation Engine*, 1982, IEEE, 19$^{th}$ Design Automation Conference.

E. Kronstadt et al., *Software Support for the Yorktown Simulation Engine*, 1982, IEEE, 19$^{th}$ Design Automation Conference.

G. Pfister, *The Yorktown Simulation Engine: Introduction*, 1982, IEEE, 19$^{th}$ Design Automation Conference.

D. Beece et al., *The IBM Engineering Verification Engine*, 1988, IEEE, 25$^{th}$ ACM/IEEE Design Automation Conference.

P. Agrawal et al., *Architecture and Design of the MARS Hardware Accelerator*, 1987, 24$^{th}$ ACM/IEEE Design Automation Conference.

D. Webber et al., *Circuit Simulation On The Connection Machine*, 1987, pp. 108–113, 24$^{th}$ ACM/IEEE Design Automation Conference, University of California, Berkeley.

E. Brunvand, *Using FPGAs to Implement Self-Timed Systems*, Jan. 8, 1992, Computer Science Department, University of Utah, Salt Lake City, Utah 84112.

P. Chan et al., *BORG: A Reconfigurable Prototyping Board Using Field-Programmable Gate Arrays*, 1992, Computer Engineering, University of California, Santa Cruz, Santa Cruz, California.

Algotronix Ltd., *CAL1024 Datasheet*, 1991, Algotronix Ltd., The Kings Buildings, TTC, Mayfield Road, Edinburg, EH9 3JL Scotland.

N. Bhat et al., *Performance-Oriented Fully Routable Dynamic Architecture For A Field Programmable Logic Device*, Jun. 1, 1993, Electronics Research Laboratory, College of Engineering, Univ. of California, Berkeley.

P. Bertin et al., *Introduction to Programmable Active Memories*, Jun. 1989, Research Report #3, Digital Equipment Corporation Paris Research Laboratories.

IBM Technical Disclosure Bulletin, *Logic Processor for Logic Simulation Machine*, Jun. 1982, Computer System Organization JA, pp. 91–94.

T. Burggraff et al., *The IBM Los Gatos Logic Simulation Machine Hardware*, 1983, IEEE, IBM Los Gatos Laboratory, Los Gatos, California.

J. Kohn et al., *The IBM Los Gatos Logic Simulation Machine Software*, 1983, IEEE, IBM Los Gatos Laboratory, Los Gatos, California.

J. Howard et al., *Using The IBM Los Gatos Logic Simulation Machine*, 1983, IEEE, IBM Los Gatos Laboratory, Los Gatos, California.

N. Koike et al., *A High Speed Logic Simulation Machine*, 1983, IEEE, C&C Systems Laboratories, Nippon Electric Co., Ltd., Kawasaki, Japan.

T. Sasaki et al., *HAL: A Block Level Hardware Logic Simulator*, 1983 IEEE 20$^{th}$ Design Automation Conference, NEC Corporation, 10, 1–Chome, Nisshin–Cho, Fuchu City, Tokyo, 183 Japan.

T. Blank, Stanford University, *A Survey of Hardware Accelerators Used in Computer-Aided Design*, Aug. 1984, IEEE.

N. Koike et al., NEC Corporation, *HAL: A High-Speed Logic Simulation Machine*, Oct. 1985, IEEE.

R. Smith, II, *Fundamentals of Parallel Logic Simulation*, 1986, pp. 2–12, IEEE 23$^{rd}$ Design Automation Conference, Microelectronics and Computer Technology Corporation, 9430 Research Blvd., Austin, Texas 78759–6509.

S. Takasaki et al., NEC Corporation, *HAL II: A Mixed Level Hardware Logic Simulation System*, 1986, pp. 581–587, IEEE 23$^{rd}$ Design Automation Conference.

P. Wynn, Xilinx Inc., San Jose, CA, *In–Circuit Emulation for ASIC–Based Designs*, VLSI Systems Design, Oct. 1986.

N. Schmitz, Monolithic Memories Inc., Santa Clara, CA, *Emulation of VLSI Devices Using LCAs*, May 20, 1987, pp. 54–62, VLSI Systems Design.

M. Saitoh et al., Fujitsu Limited, *Logic Simulation System Using Simulation Processor (SP)*, 1988, pp. 225–230, IEEE 25$^{th}$ ACM/IEEE Design Automation Conference.

N. Koike et al., *MAN–YO: Mixed Level Parallel Logic Simulation Engine*, C&C Systems Laboratories, NEC Corporation, 4–1–1 Miyazak, Miyamee–ku, Kawasaki 213, Japan.

B. Milne, *Put The Pedal To The Metal With Simulation Accelerators*, Electronic Design, Sep. 1987, pp. 39–52, Computer–Aided Engineering.

G. Meister, *A Survey on Parallel Logic Simulation*, Sep. 21, 1993, Department of Computer Science, University of Saarland, P.O. Box 1150, 66041 Saarbrücken, Fed. Rep. Germany.

D. Pryor et al., *Text Searching On Splash 2,* Apr. 5–7, 1993, pp. 172–177, Proceedings of the IEEE Workshop on FPGAs for Custom Computing Machines, IEEE Computer Society Press, Los Alamitos, California.

D. Hoang, *Searching Genetic Databases on Splash 2,* Apr. 5–7, 1993, pp. 185–191, Proceedings of the IEEE Workshop on FPGAs for Custom Computing Machines, IEEE Computer Society Press, Los Alamitos, California.

J. Graydon, *Building a Verification System for High–Performance ASICs,* Mar. 1988, pp. 64–67, VLSI Systems Design.

K. Gudger, *PLD Enhancements for Implementing Subsystems,* Oct. 1986, pp. 48–52, VLSI Systems Design.

G. De Micheli, *Synchronous Logic Synthesis: Algorithms for Cycle–Time Minimization,* Jan. 1991, pp. 63–73, IEEE Transactions on Computer–Aided Design, vol. 10, No. 1.

P. Bertin et al., *Programmable Active Memories: A Performance Assessment,* Research Report 24, Mar. 1993, Digital Equipment Corporation Paris Research Laboratory.

M. Shand, *Measuring Systems Performance With Reprogrammable Hardware,* Research Report 19, Aug. 1992, Digital Equipment Corporation Paris Research Laboratory.

C. Leiserson et al., *Optimizing Synchronous Circuitry by Retiming* (Preliminary Version).

S. Malik et al., *Retiming and Resynthesis: Optimizing Sequential Networks With Combinational Techniques,* IEEE Transactions on Computer–Aided Design, vol. 10, No. 1, Jan. 1991, pp. 74–84.

P. Maurer, *Two New Techniques for Unit–Delay Compiled Simulation,* IEEE Transactions on Computer–Aided Design, vol. 11, No. 9, Sep. 1992, pp. 1120–1130.

S. Note et al., *Combined Hardware Selection and Pipelining in High–Performance Data–Path Design,* IEEE transactions on Computer–Aided Design, vol. 11, No. 4, Apr. 1992, pp. 413–423.

S. Borkar et al., *Supporting Systolic and Memory Communication in iWarp,* Dec. 11, 1990, School of Computer Science, Carnegie Mellon University, Pittsburgh, PA 15213, Intel Corporation, C04–01, 5200 N.E. Elam Young Pkwy., Hillsboro, Oregon 97124.

K. Abdalla, *The NuMesh: A Modular, Scalable Communications Substrate,* MIT Laboratory for Computer Science, Cambridge, MA, Proceedings of the International Conference On Supercomputing, Jul. 1993.

S. Takasaki, et al., *Block–Level Hardware Logic Simulation Machine,* IEEE Transactions on Computer–Aided Design, vol. CAD–6, No. 1, Jan. 1987, pp. 46–54.

N. Koike, et al. NEC Corporation, *HAL: A High–Speed Logic Simulation Machine,* Oct. 1985 IEEE.

R. Barto, *A Computer Architecture For Logic Simulation,* The University of Texas at Austin, Ph.D. Dissertation 1980, University Microfilms International, Ann Arbor, MI 48106, Copyright 1981.

G. Bostoc, *Programmable Logic Handbook,* Second Edition, 1993, An Imprint of Butterworth–Heinemann Ltd., Linacre House, Jordan Hill, Oxford OX2 8DP.

C.B. Lee et al., *Time Division Multiplexing With the LCA Device,* Monolithic Memories, pp. 44–52, 1987.

A. Linde et al., *Using FPGAs to Implement a Reconfigurable Highly Parallel Computer,* Department of Computer Engineering, Chalmers University of Technology, S–41296 Göteborg, Sweden, 1992, pp. 200–210.

T. H. Meng, *Synchronization Design For Digital Systems,* Kluwer Academic Publishers, pp. 134–139.

Y. Wei et al., *Multiple–Level Partitioning: An Application to the Very Large–Scale Hardware Simulator,* IEEE Journal of Solid–State Circuits. vol. 26, No. 5, pp. 706–716, May 1991.

L. Couch, II, *Time–Division Multiplexing,* Digital and Analog Communication Systems, Sixth edition, Prentice Hall New Jersey, pp. 199–208.

M. Gokhale et al., "SPLASH: A Reconfigurable Linear Logic Array," Proceedings of the 1990 International Conference on Parallel Processing, pp. 526–532 (1990).

M. Gokhale et al., "Building and Using a Highly Parallel Progammable Logic Array," IEEE (Jan. 1991).

D. Hoang, "A Systolic Array for the Sequence Alignment Problem," Department of Computer Science, Brown University, Providence, Rhode Island (Apr. 13, 1992).

J. Arnold et al., "Splash 2," Proceedings, 4th Annual ACM Symposium on Parallel Algorithms and Architectures (Jun. 1992).

W. Dally, "Virtual–Channel Flow Control," IEEE Transactions on Parallel and Distributed Systems, vol. 3, No. 2 (Mar. 1992).

\* cited by examiner

EX PARTE REEXAMINATION CERTIFICATE ISSUED UNDER 35 U.S.C. 307

THE PATENT IS HEREBY AMENDED AS INDICATED BELOW.

Matter enclosed in heavy brackets [ ] appeared in the patent, but has been deleted and is no longer a part of the patent; matter printed in italics indicates additions made to the patent.

AS A RESULT OF REEXAMINATION, IT HAS BEEN DETERMINED THAT:

The patentability of claims 27–33 and 35–42 is confirmed.

Claim 34 is cancelled.

Claim 1 is determined to be patentable as amended.

Claims 2–26, dependent on an amended claim, are determined to be patentable.

1. A reconfigurable electronic system comprising:

a plurality of reprogrammable logic modules, each logic module having a plurality of pins for communicating signals between logic modules;

inter-module connections between pins of different logic modules; and a configurer to configure each logic module to define a partition of a specified target circuit with interconnections between the partitions of the target circuit being provided through pins and inter-module connections, [a] *the* partition of the [configured] *specified* target circuit having a number of interconnections to other partitions that exceeds the number of pins on the logic module and the logic module being configured to communicate through virtual interconnections in a time-multiplexed fashion through at least one pin, the inter-module [communications] *connections* including interconnections which extend through intermediate reconfigurable logic modules.

* * * * *